United States Patent [19]

Kim

[11] Patent Number: 5,391,982
[45] Date of Patent: Feb. 21, 1995

[54] APPARATUS FOR AUTOMATICALLY RECOGNIZING A FREQUENCY OF A POWER SUPPLY AND METHOD THEREOF

[75] Inventor: Jong R. Kim, Seoul, Rep. of Korea

[73] Assignee: Goldstar Co., Ltd., Seoul, Rep. of Korea

[21] Appl. No.: 20,819

[22] Filed: Feb. 22, 1993

[51] Int. Cl.⁶ .......................................... G01R 23/10
[52] U.S. Cl. .................... 324/76.39; 324/76.48
[58] Field of Search ............... 307/510, 525; 340/658; 377/20; 324/76.41, 76.48, 76.62, 76.39

[56] References Cited

U.S. PATENT DOCUMENTS

| | | | |
|---|---|---|---|
| 3,697,781 | 10/1972 | McLean | 307/510 |
| 3,710,262 | 1/1973 | Sorenson | 324/76.48 X |
| 4,760,536 | 7/1988 | Curtis | 324/76.48 X |
| 4,769,611 | 9/1988 | Frierdich | 307/519 X |
| 4,800,508 | 1/1989 | Frederich | 324/76.39 |
| 4,928,052 | 5/1990 | Fujioka et al. | 318/762 |
| 4,993,052 | 2/1991 | Hammelsbacher | 377/52 |
| 5,253,179 | 10/1993 | Rickett | 364/484 |

Primary Examiner—Walter E. Snow
Assistant Examiner—Christopher M. Tobin
Attorney, Agent, or Firm—Morgan & Finnegan

[57] ABSTRACT

An apparatus for recognizing a frequency of an electric power being applied to an electric/electronic device for preventing an error operation of the electric/electronic device generated when the frequency of power supply to be applied differs from the operating frequency determined at the time of manufacture of the electric/electronic device. The apparatus has a power transformer for transforming commercial alternating current power supply to a driving voltage of the device, a period detecting section for shaping a wave form of output of the power transformer, and simultaneously generating a period detecting signal at every period of that output wave form, and a control section for counting a number of times said period detecting signal is generated during a predetermined time period, whereby the frequency of the applied power supply on basis of the number of times.

7 Claims, 2 Drawing Sheets

5,391,982

APPARATUS FOR AUTOMATICALLY RECOGNIZING A FREQUENCY OF A POWER SUPPLY AND METHOD THEREOF

FIELD OF THE INVENTION

The present invention relates to a power control, and more particularly to an apparatus and method for automatically recognizing a frequency of power supply to be applied when the power supply would be applied to an electric/electronic device (hereinafter called just as device).

BACKGROUND OF THE INVENTION

A device is made to operate with a predetermined operating frequency. In general, a commercial alternating current power supply is used worldwide, power frequencies of 50 Hz or 60 Hz.

Accordingly, if a part is mistaken in assembling or an operating frequency is set wrong in manufacture, or if a device is applied with a power of frequency other than a predetermined operating frequency upon use, there has been a problem that the device could not execute normal operation. For instance, when a user applies a commercial power supply of 50 Hz to a device for 50 Hz which was set wrong to 60 Hz in an operating frequency when manufactured, the device will execute error operation. Otherwise, when a user has purchased and used a device in a country using 50 Hz, and then if the user has emigrated to another country using 60 Hz and he or she has applied the commercial alternating current power supply of 60 Hz to the device, the device will execute an error operation.

SUMMARY OF THE INVENTION

Therefore, it is an object of the present invention to provide an apparatus for automatically recognizing a frequency of power supply during an initial operation after an alternating current power supply is applied, and being capable of selecting an operating frequency to match the recognized frequency.

Another object of the present invention is to provide a method for automatically recognizing a frequency of power supply during an initial operation after an alternating current power supply is applied, and being capable of selecting an operating frequency to match the recognized frequency.

An apparatus for automatically recognizing a frequency of power supply, comprises a power transformer for transforming the commercial alternating current power supply to an operating voltage of the device, a period detecting means for shaping a wave form of output of the power transformer whereby generating a period detecting signal at every period of the wave form of the output, and a means for counting up the number of times generated with said period detected signal during a predetermined time period whereby discriminating the frequency of the applied power supply on the basis of the number of times.

Moreover, a method for automatically recognizing a frequency of power supply, comprises the steps of delaying an operation of a device during a predetermined time period at an initial time of power supply being applied whereby counting up the generated number of period detecting signal generated per every period of the applied power supply frequency, comparing the generated numbers of the counted period detecting signal with a predetermined reference value whereby discriminating the frequency of an applied power supply frequency, and selecting an operating frequency matching with the discriminated applying power supply frequency whereby driving the device.

DETAILED DESCRIPTION OF THE INVENTION

The present invention will be described in more detail with reference to the accompanying drawings.

In an embodiment of the present invention, since the frequency used worldwide of commercial alternating current power supply is 50 Hz or 60 Hz, it will be explained only for these power supply frequencies.

Figure 1:
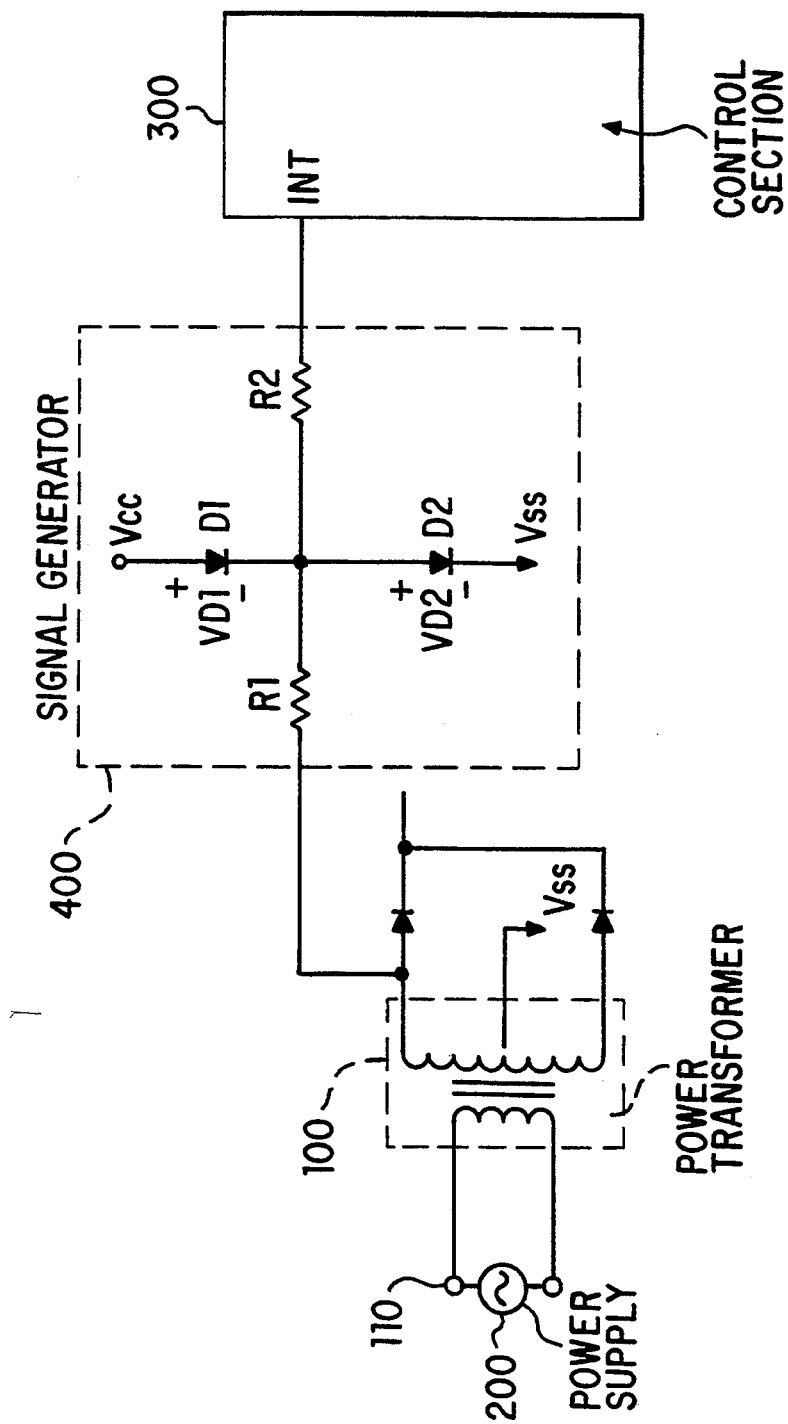
FIG. 1 shows an apparatus according to the present invention.

In accordance with FIG. 1 which is an embodiment of the present invention, a primary side 110 of a power transformer 100 is connected to a commercial alternating current power supply 200, and a secondary side of the power transformer 100 is connected to a control section 300 through a period detecting signal generating section 400.

The period detecting signal generating section 400 is constituted such that a (+) terminal of a diode D1 connected with a reference voltage Vcc and a (−) terminal of a diode D2 connected with a standard voltage Vss are connected in series together, and another end of a resistor R1 connected at one end to the secondary side of the power transformer 100 and another end of a resistor R2 connected at one end to an input terminal INT of the control section 300 are connected to the (−) terminal of the diode D1 or to the (+) terminal of the diode D2. Here, the reference voltage Vcc is set lower than the standard voltage Vss.

When the commercial alternating current power voltage is applied to the primary side of the power transformer 100, it is transformed to a predetermined device driving voltage and applied to the period detecting signal generating section 400 through the secondary side of the power transformer 100. At this moment, when the voltage applied to the period detecting signal generating section 400 is higher than the reference voltage Vss+voltage VD2 across the diode D2, the standard voltage Vss+the voltage VD2 across the diode D2 is applied to an input terminal INT, and when the voltage applied to the period detecting signal generating section 400 is lower than the reference voltage Vcc−the voltage VD1 across the diode D1, a predetermined signal, i.e., the reference voltage Vcc−the voltage VD1 across the diode D1 is applied to the input terminal INT of the control section 300.

And, above-described voltages have following expression of relation.

$$Vss > Vcc, \ Vss + VD2 > 0, \ \text{and} \ Vcc - VD1 < 0$$

On the other hand, since the commercial alternating current power supply is a sinusoidal wave, the signal is generated by one time per period of the frequency. Accordingly, this signal can be called a period detecting signal.

After the operation as these are executed during a predetermined delay time period, the counted period detecting signal is compared with a predetermined reference value, as a result, a frequency of an inputting power supply is recognized.

Here, a predetermined reference value is determined in accordance with a predetermined delay time as describing below.

If it assumed that the period is T, the frequency is f, since T=1/f [second], if the power supply is applied at a zero point, in case of the commercial alternating current power supply of 50 Hz, it will be generated by one time at every 20 ms, and in case of the commercial alternating current power supply of 60 Hz, the period detecting signal will be generated by one time at approximately every 16.7 ms.

However, since the case that the alternating current power supply being not applied at zero point is practically much more, the period detecting signal is detected as in the following table.

TABLE

| Delay time [ms] | | Detected No. (times) | | Delay time [ms] / | Detected No. (times) | |
|---|---|---|---|---|---|---|
| | | 50 Hz | 60 Hz | | 50 Hz | 60 Hz |
| | 16.7–20 | 0–1 | 0–2 | 133.3 133.3–140 | 6–7 | 8–9 |
| | 33.3–40 | 1–2 | 2–3 | 140–150 | 7–8 | 8–9 |
| | 50–60 | 2–3 | 3–4 | 160 150–160 | 7–8 | 8–9 |
| | 6.7–80 | 3–4 | 4–5 | . . | | |
| | 83.3–100 | 4–5 | 5–6 | . . | | |
| | | | | . . | | |
| 100 | 100–116.7 | 5–6 | 6–7 | 200–216.7 | 10–11 | 12–1 |
| 200 | 116.7–120 | 5–6 | 6–7 | 200 216.7–220 | 10–11 | 13–1 |
| 116.7 | 116.7–120 | 5–6 | 7–8 | 240 220–233.3 | 11–12 | 13–1 |
| 140 | 120–133.3 | 6–7 | 7–8 | 233.2–240 | 11–12 | 14–1 |
| | 133.3–140 | 6–7 | 8–9 | | | |

Figure 2:
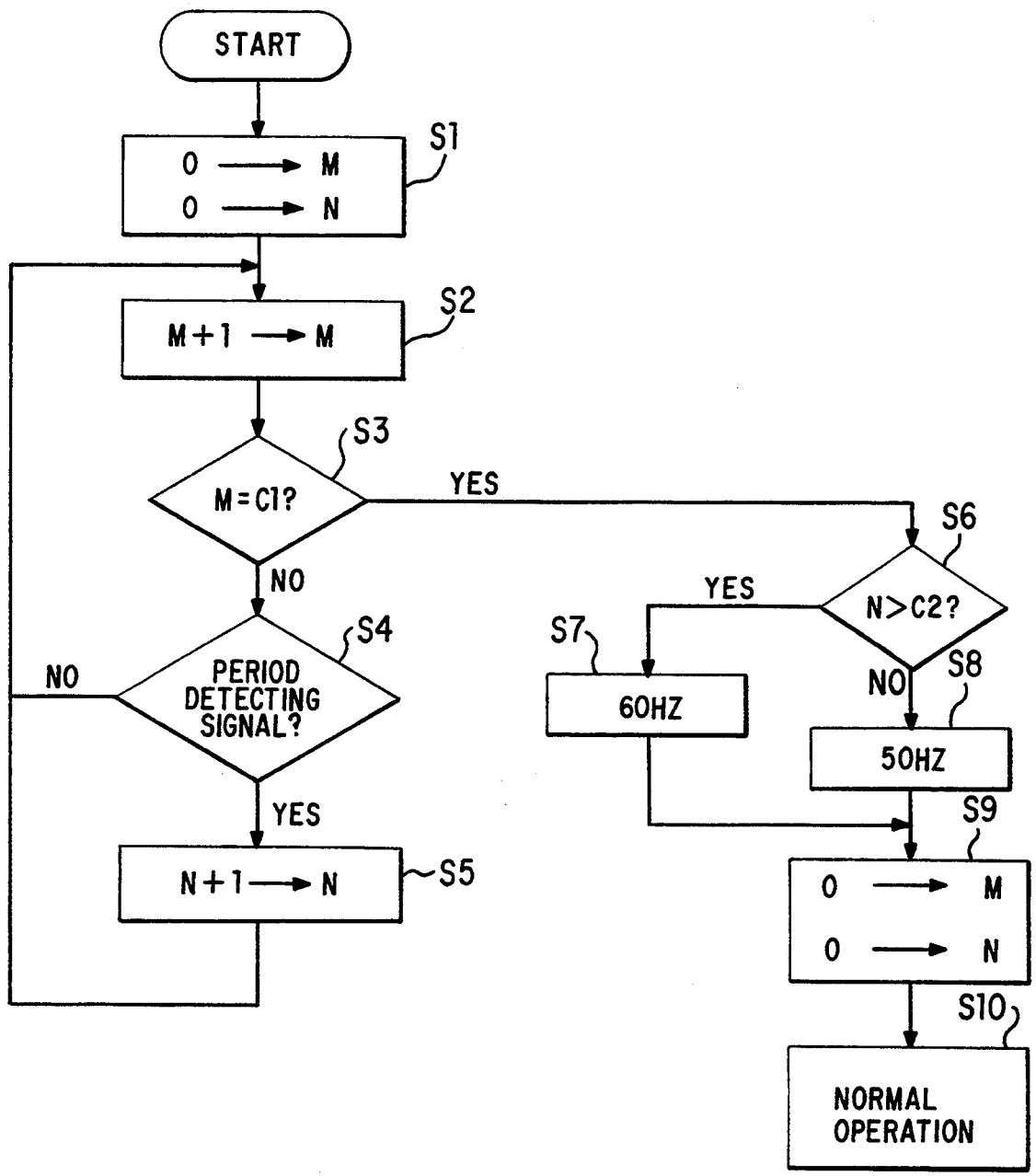
FIG. 2 is a flow chart depicting the operation of FIG. 1.

As will be seen at above table, at between 216.7–220 of delay time, and when the value of C2 in FIG. 2 is set as 12, the frequencies of 50 Hz and 60 Hz can be most exactly discriminated. (It is same at the time of 223.3–240 [ms].) Hereinafter, when explaining the control flow chart of the present invention with reference to the FIG. 2, it will be as follows.

When the device is applied with the power supply at OFF state, while delaying the driving of the device during a predetermined time period, the generated number of times of the period detecting signal generated during that delayed time period are counted. This is called a delay stage, and when explaining the delay stage more in detail, it will be as follows.

When the commercial alternating current power supply is applied, firstly variables M and N are initialized (Step S1). Here, the variable M represents a present time, and the variable N represents the number of times generated with the period detecting signal.

The present time is made to be increased by a unit time (for example, by 1[ms]) (Step S2), and the variable M causing from the present time and a predetermined delay time C1 are compared whereby whether or not the predetermined delay time C1 has elapsed is discriminated(Step S3).

When the predetermined delay time C1 is not elapsed yet, whether or not the period detecting signal being generated is discriminated(Step S4), and when the period detecting signal is not detected, it is returned to the step S2. When the period detecting signal is generated, the variable N, indicating the number of times of period detecting signal generation or detection is increased by 1 (Step S5); and then it is returned to step S2.

When it is discriminated that the predetermined delay time C1 has elapsed, the variable N from the generated number of times of the counted period detecting signal during the delay stage and a predetermined reference value C2 corresponding to predetermined delay time C1 are compared, the frequency of the inputting power supply is discriminated. This is called a discriminating stage, and when explaining the judgement stage more in detail, it will be as follows.

When it is recognized that the predetermined delay time C1 is elapsed, the variable N from the generated number of times of the counted period detecting signal during delay stage and the predetermined reference value C2 determined in accordance with the predetermined delay time C1 are compared (Step S6), the frequency of the inputting power supply is recognized(-Steps S7 and S8), and then the two variables M and N are cleared (Step S9).

When the frequency of the inputting power supply is recognized, an operating frequency coinciding to the recognized frequency is selected whereby normal operation of the device is executed(Step S10).

As described above, the present invention counts up the predetermined signal generating number of times generated at every period of the applied power frequency during a predetermined delay time, and compares that number of times with a predetermined reference value which is set in accordance with said predetermined delay time period, so that the frequency of the applied power supply is automatically recognized.

As a result of that, any error operation of the device generated from a difference between applied power frequency and operating frequency of the device, can be prevented.

In an embodiment of the present invention, it is explained for 50 Hz and 60 Hz which are the frequencies of generally used commercial alternating current power supply, however it is reasonable that the present invention can be applied to frequencies other than those exemplified.

Although the invention has been described in conjunction with specific embodiments, it is evident that many alternatives and variations will be apparent to those skilled in the art in light of the foregoing description. Accordingly, the invention is intended to embrace all of the alternatives and variations that fall within the spirit and scope of the appended claims.

What is claimed is:

1. An apparatus for recognizing a frequency of an electric power supply including a commercial alternating current power supply supplying power to an electric/electronic device, comprising:

delaying means for delaying the power generated by the commercial alternating current power supply from being supplied to the electric/electronic device;

a power transformer for transforming the power generated by the commercial alternating current power supply to a driving voltage for the electric/electronic device and outputting an output wave form;

period detecting means for shaping the output wave form received from said power transformer producing a shaped wave form having periods and generating a period detecting signal at each of the periods of the shaped wave form;

counting means for counting a number of times said period detecting signal is generated during a predetermined time period, and discriminating the frequency of the electric power supply on the basis of the number of times; and adjusting means for adjusting a device frequency of the electric/electronic device in accordance with the frequency discriminated by said counting means for operating the electric/electronic device using the frequency;

the period detecting means further including:

a first diode connected with a reference voltage to a positive terminal thereof:

a second diode connected with a standard voltage to a negative terminal thereof; wherein a negative terminal of the first diode and a positive terminal of the second diode being connected in series;

a first resistor connected with a secondary side of said power transformer to one end thereof, and connected to the negative terminal of the first diode and to the positive terminal of the second diode to another end thereof; and a second resistor connected with an input terminal of said adjusting means to one end thereof, and connected to the negative terminal of the first diode and to the positive terminal of the second diode to another end thereof.

2. An apparatus as defined in claim 1, wherein the reference voltage, the standard voltage, a voltage across the first diode, and a voltage across the second diode have the following relationship:

Reference voltage<Standard voltage;

Standard voltage+the voltage across the second diode>0; and

Reference voltage−the voltage across the first diode<0.

3. A method for recognizing a frequency of an electric power supply including a commercial alternating current power supply supplying power to an electric/electronic device, comprising:

delaying the power generated by the commercial alternating current power supply from being supplied to the electric/electronic device during a predetermined time period when power is initially supplied;

with a power transformer, transforming the power generated by the commercial alternating current power supply to a driving voltage for the electric/electronic device;

simultaneously counting a number of times a period detecting signal is generated during a predetermined time period of applied power frequency using a period detecting means;

comparing the generated number of times of the counted period detecting signal with a predetermined reference value thereby discriminating the frequency of the power supply; and with a control means, selecting an operating frequency which matches the discriminated power supply frequency to drive the electric/electronic device;

said period detecting means including:

a first diode connected with a reference voltage to a positive terminal thereof;

a second diode connected with a standard voltage to a negative terminal thereof; wherein a (−) terminal of the first diode and a positive terminal of the second diode being connected in series a first resistor connected with a secondary side of said power transformer to one end thereof, and connected to the negative terminal of the first diode and to the positive terminal of the second diode to another end thereof; and a second resistor connected with an input terminal of said control means to one end thereof, and connected to the negative terminal of the first diode and to the positive terminal of the second diode to another end thereof.

4. A method as defined in claim 3, wherein said predetermined reference value is determined in accordance with the electric power supply frequency and predetermined delay time.

5. A method for recognizing automatically whether a frequency of an electric power supply including a commercial alternating current power supply supplying power to an electric/electronic device is 50 Hz or 60 Hz comprising:

delaying operation of an electric/electronic device during a predetermined time period when power is initially supplied;

with a power transformer, transforming the power generated by the commercial alternating current power supply to a driving voltage for the electric/electronic device;

simultaneously counting a number of times a period detecting signal is generated during a predetermined time period of applied power supply frequency using a period detecting means;

comparing the generated number of times of the counted period detecting signal with a predetermined reference value thereby discriminating the frequency of the power supply; and with a control means, selecting an operating frequency which matches the discriminated power supply frequency to drive the device;

said period detecting means including:

a first diode connected with a reference voltage to a positive terminal thereof;

a second diode connected with a standard voltage to a negative terminal thereof; wherein a negative terminal of the first diode and a positive terminal of the second diode being connected in series, a first resistor connected with a secondary side of said power transformer to one end thereof, and connected to the negative terminal of the first diode and to the positive terminal of the second diode to another end thereof; and a second resistor connected with an input terminal of said control means to one end thereof, and connected to the negative terminal of the first diode and to the positive terminal of the second diode to another end thereof.

6. A method as defined in claim 5, wherein said predetermined time period is 216.7–220 [ms], and said predetermined reference value is 12.

7. A method as defined in claim 5, wherein said predetermined time is 233.3–240 [ms], and said predetermined reference value is 13.

* * * * *